US011477408B2

(12) United States Patent
Song et al.

(10) Patent No.: US 11,477,408 B2
(45) Date of Patent: Oct. 18, 2022

(54) IMAGE SENSOR AND ANALOG-TO-DIGITAL CONVERTOR

(71) Applicant: SK hynix Inc., Gyeonggi-do (KR)

(72) Inventors: Jeong Eun Song, Gyeonggi-do (KR); Yu Jin Park, Gyeonggi-do (KR); Sung Uk Seo, Gyeonggi-do (KR); Min Seok Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/225,455

(22) Filed: Apr. 8, 2021

(65) Prior Publication Data
US 2022/0116563 A1  Apr. 14, 2022

(30) Foreign Application Priority Data

Oct. 13, 2020 (KR) .................. 10-2020-0131755

(51) Int. Cl.
*H04N 5/378* (2011.01)
*H04N 5/3745* (2011.01)
*H03M 1/34* (2006.01)
*H04N 5/353* (2011.01)
*G01S 7/4865* (2020.01)
*G01S 17/894* (2020.01)
*H01L 27/146* (2006.01)
*G01S 17/36* (2006.01)
*G01S 7/4915* (2020.01)
*G01S 7/4914* (2020.01)
(Continued)

(52) U.S. Cl.
CPC ........... *H04N 5/378* (2013.01); *G01S 7/4863* (2013.01); *G01S 7/4865* (2013.01); *G01S 7/4914* (2013.01); *G01S 7/4915* (2013.01);
*G01S 17/36* (2013.01); *G01S 17/894* (2020.01); *H01L 27/14612* (2013.01); *H03M 1/182* (2013.01); *H03M 1/34* (2013.01); *H04N 5/353* (2013.01); *H04N 5/37455* (2013.01); *H04N 5/37457* (2013.01)

(58) Field of Classification Search
CPC .... H04N 5/353; H04N 5/37457; H04N 5/378; H04N 5/37455; H01L 27/14612; H03M 1/182; H03M 1/34; G01S 7/4863; G01S 7/4865; G01S 7/4914; G01S 7/4915; G01S 17/36; G01S 17/894
See application file for complete search history.

(56) References Cited

U.S. PATENT DOCUMENTS 7,345,613 B2 * 3/2008 Higuchi ................. H04N 5/378
                                                            348/241
7,443,436 B2   10/2008 Masuyama et al.
(Continued)

FOREIGN PATENT DOCUMENTS

KR        10-2011406         8/2019

*Primary Examiner* — Lin Ye
*Assistant Examiner* — Chriss S Yoder, III
(74) *Attorney, Agent, or Firm* — IP & T Group LLP

(57) ABSTRACT

An image sensor including a pixel of a first tap. a pixel of a second tap. an operational amplifier configured to perform an auto zeroing operation with a pixel signal of the pixel of the second tap applied, and perform an operation for comparison between a ramp voltage and a signal output from the pixel of the first tap, with a pixel signal of the pixel of the first tap applied, and a counter circuit configured to generate a digital code in response to an output of the operational amplifier.

14 Claims, 5 Drawing Sheets

(51) Int. Cl.
*G01S 7/4863* (2020.01)
*H03M 1/18* (2006.01)

(56) References Cited

U.S. PATENT DOCUMENTS

| | | | | |
|---|---|---|---|---|
| 8,390,486 B2* | 3/2013 | Wang | ...................... | H04N 5/378 |
| | | | | 341/120 |
| 9,055,250 B2* | 6/2015 | Park | ........................ | H04N 5/357 |
| 2013/0300906 A1* | 11/2013 | Yan | ......................... | H03M 1/56 |
| | | | | 348/302 |
| 2015/0237274 A1* | 8/2015 | Yang | ................... | H04N 5/3575 |
| | | | | 348/308 |
| 2019/0166323 A1* | 5/2019 | Saito | ......................... | G06T 7/55 |

* cited by examiner

IMAGE SENSOR AND ANALOG-TO-DIGITAL CONVERTOR

CROSS-REFERENCE TO RELATED APPLICATIONS

The present application claims priority to Korean Patent Application No. 10-2020-0131755, filed on Oct. 13, 2020, which is herein incorporated by reference in its entirety.

BACKGROUND

1. Field

This disclosure relates to image sensors.

2. Description of the Related Art

Recently under development are image sensors that provide a 3D distance image by simultaneously measuring a certain range of distances. Acquiring such a distance image is based on Time-of-Flight (TOF) technology. This technique measures the distance by measuring the time taken for light to travel back and forth between a light source near the image sensor to an object.

TOF technology is largely divided into two methods, the direct method and the indirect method. The direct method converts the time taken for a round-trip of a pulse type of light into a distance. To improve accuracy, the direct method needs to make the pulse width as narrow as possible in consideration of the light speed. Further, the direct method requires very precise time measurement.

On the other hand, the indirect method is implemented to extract the distance by radiating a modulated light then receiving a reflected light and then detecting the phase difference between the radiated light and the reflected light, rather than directly measuring the TOF. Specifically, in the indirect method, the reflected light is detected using the pixels of tap A and the pixels of tap B that are activated at different times, and the distance to the object is measured using the difference between the analog-to-digital conversion of the pixel signal of tap A and the analog-to-digital conversion of pixel signal of tap B.

The indirect method separately requires an analog-to-digital converter for analog-to-digital conversion of the A tap pixel signal and an analog-to-digital converter for analog-to-digital conversion of the B tap pixel signal, which is a burden for the indirect method in view of a space to be occupied in an image sensor.

SUMMARY

Embodiments of the present invention may reduce the area of the image sensor by analog-to-digital converting the voltage difference between the pixel signals of two taps.

According to an embodiment, an image sensor comprises a pixel of a first tap; a pixel of a second tap; an operational amplifier configured to perform an auto zeroing operation with a pixel signal of the pixel of the second tap applied, and to perform an operation for comparison between a ramp voltage and a pixel signal output from the pixel of the first tap with the pixel signal of the pixel of the first tap applied; and a counter circuit configured to generate a digital code in response to an output of the operational amplifier.

According to an embodiment, an analog-to-digital converter comprises, an operational amplifier configured to perform an auto zeroing operation with a first voltage applied, and an operation of comparison between a second voltage and a ramp voltage with the second voltage applied; and a counter circuit configured to generate a digital code in response to an output of the operational amplifier.

According to an embodiment, an operating method of an image sensor comprises, receiving, by an operational amplifier, a first voltage from a pixel of a first tap; performing, by the operational amplifier, an auto zeroing operation thereon; comparing, by the operational amplifier, a ramp voltage with a second voltage from a pixel of a second tap; and generating, by a counter, a digital code representing difference between the first and second voltages based on a result of the comparing.

According to embodiments of the present invention, a voltage difference between pixel signals of two taps may be analog-to-digital converted.

DETAILED DESCRIPTION

Hereinafter, various embodiments of the disclosure are described in detail with reference to the accompanying drawings to allow one of ordinary skill in the art to readily practice the technical spirit of the present invention. Well known components or elements irrelevant to the subject matter of the disclosure may be omitted from the description. The same or substantially the same reference denotations are used to refer to the same or substantially the same elements throughout the specification and the drawings.

Figure 1:
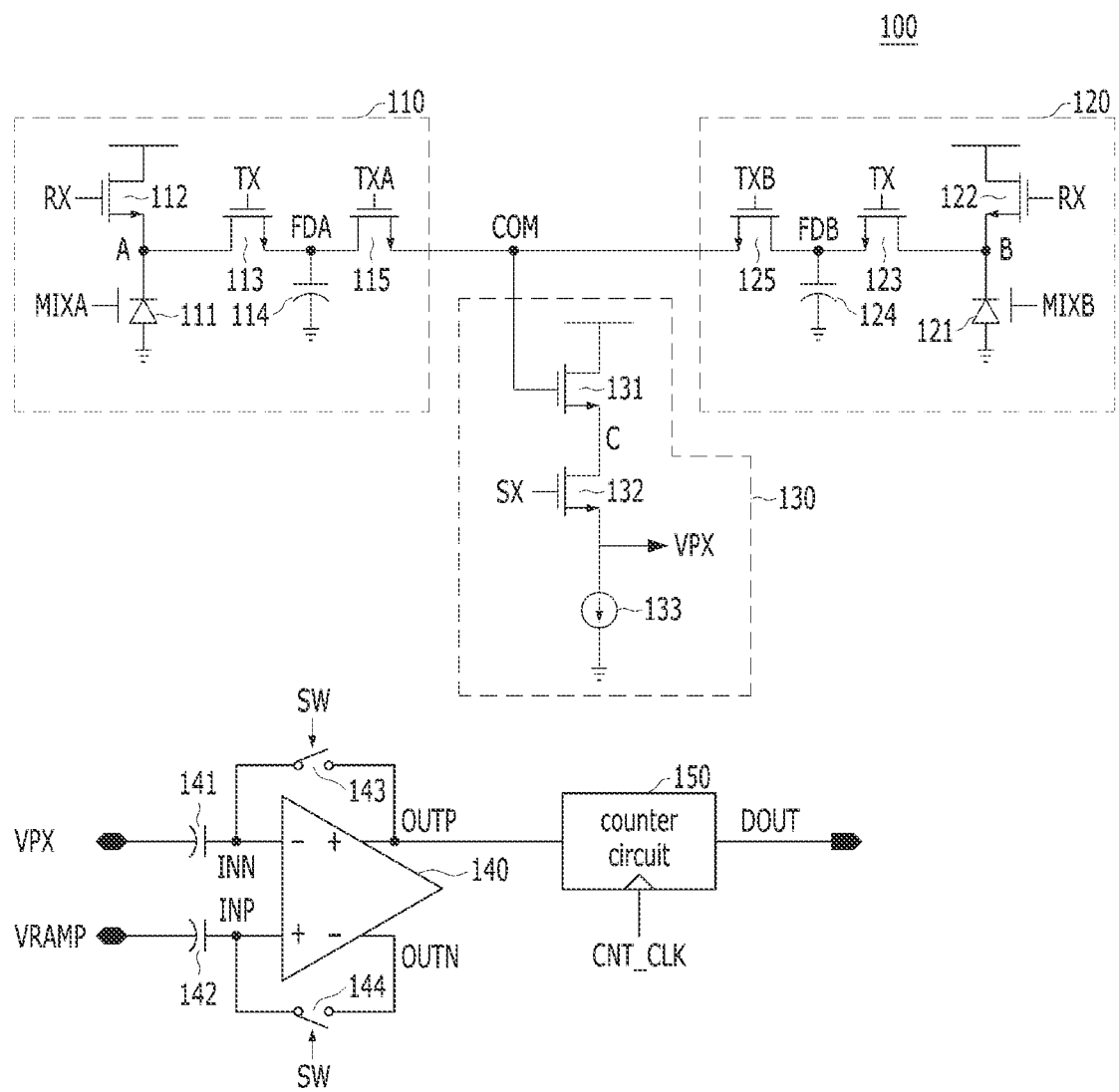
FIG. 1 is a view illustrating a configuration of an image sensor 100 according to an embodiment of the present invention.

FIG. 1 is a view illustrating a configuration of an image sensor 100 according to an embodiment of the present invention.

Referring to FIG. 1, an image sensor 100 may include a pixel 110 of a first tap, a pixel 120 of a second tap, a pixel signal generator 130, an operational amplifier 140, a counter circuit 150, capacitors 141 and 142, and switches 143 and 144.

The pixel 110 of the first tap may detect light in a period in which a signal MIXA is activated. The pixel 110 of the first tap may include a first photodetector 111, a first reset transistor 112, a first transfer transistor 113, a first capacitor 114, and a first tap transfer transistor 115. The first photodetector 111 may perform a photoelectric conversion function. The first photodetector 111 may be connected between a ground voltage terminal and a node A. The first photodetector 111 may receive light from the outside and generate a photo charge based on the received light. The first photo detector 111 may be implemented using at least one of a photo diode, a photo transistor, a photo gate, a pinned photo diode, and a combination thereof. The first photodetector 111 may be activated in a period in which the signal MIXA is activated to a high level under the control of the signal MIXA. The first reset transistor 112 may transmit a power voltage to the node A in response to the reset signal RX. The first transfer transistor 113 may electrically connect the node A and a first floating diffusion node FDA in response to a transfer signal TX. The first floating diffusion node FDA may be a node in which electric charges corresponding to light detected by the first photodetector 111 or electric charges corresponding to an initialization voltage are accumulated. The first capacitor 114 may be connected to the first floating diffusion node FDA. The first tap transfer transistor 115 may electrically connect the first floating diffusion node FDA and an output node COM in response to a first tap transfer signal TXA.

The pixel 120 of the second tap may detect light in a period in which the signal MIXB is activated. Since the signal MIXB is activated in a period different from that of the signal MIXA, the pixel 120 of the second tap may detect light in a period different from that of the pixel 110 of the first tap. The pixel 120 of the second tap may include a second photodetector 121, a second reset transistor 122, a second transfer transistor 123, a second capacitor 124, and a second tap transfer transistor 125. The second photodetector 121 may perform a photoelectric conversion function. The second photodetector 121 may be connected between a ground voltage terminal and a node B. The second photodetector 121 may receive light from the outside and generate a photo charge based on the received light. The second photodetector 121 may be activated in a period in which the signal MIXB is activated to a high level under the control of the signal MIXB. The second reset transistor 122 may transmit a power voltage to the node B in response to the reset signal RX. The second transfer transistor 123 may electrically connect the node B and a second floating diffusion node FDB in response to a transfer signal TX. The second floating diffusion node FDB may be a node in which electric charges corresponding to light detected by the second photodetector 121 or electric charges corresponding to an initialization voltage are accumulated. The second capacitor 124 may be connected to the second floating diffusion node FDB. The second tap transfer transistor 125 may electrically connect the second floating diffusion node FDB and an output node COM in response to a second tap transfer signal TXB.

The pixel signal generator 130 may generate a pixel signal VPX using the voltage level of the output node COM of the pixel 110 of the first tap and the pixel 120 of the second tap. During the interval in which the first tap transfer signal TXA is activated, the voltage of the first floating diffusion node FDA is transferred to the output node COM. Therefore, in this case, the pixel signal VPX generated by the pixel signal generator 130 may be a pixel signal of the pixel 110 of the first tap. During the interval in which the second tap transfer signal TXB is activated, the voltage of the second floating diffusion node FDB is transferred to the output node COM. Therefore, in this case, the pixel signal VPX generated by the pixel signal generator 130 may be a pixel signal of the pixel 120 of the second tap. The pixel signal generator 130 may include a driving transistor 131 that supplies current to the node C in response to the voltage level of the output node COM, a selection transistor 132 that transfers the current of the node C to the node where the pixel signal VPX is output when a selection signal SX is activated, and a current source 133 that sinks the current from the node where the pixel signal VPX is output. The pixel signal generator 130 may generate the pixel signal VPX with a level proportional to the voltage level of the output node COM during the period in which the selection signal SX is activated.

The operational amplifier 140 may receive the pixel signal VPX to an input terminal INN through the first capacitor 141 and a ramp voltage VRAMP to an input terminal INP through the second capacitor 142. During the auto zeroing operation of the operational amplifier 140, the first switch 143 may turn on to short the input terminal INN and the output terminal OUTP, and the second switch 144 may turn on to short the input terminal INP and the output terminal OUTN. The Input terminal INN may be a negative (−) input terminal, the input terminal INP may be a positive (+) input terminal, the output terminal OUTP may be a positive (+) output terminal, and the output terminal OUTN may be a negative (−) output terminal. As will be described later, during the auto zeroing operation of the operational amplifier 140, the auto zeroing operation may be performed while the pixel signal VPX of the second pixel 120 is applied to the operational amplifier 140 and, thereafter, the operation of comparison with the ramp voltage VRAMP may be performed while the pixel signal VPX of 110 is applied to the operational amplifier 140, so that an analog-to-digital conversion operation may be performed on a voltage corresponding to a voltage difference between the pixel signal VPX of the first pixel and the pixel signal VPX of the second pixel.

The counter circuit 150 may generate a digital code DOUT by counting the counting clock CNT_CLK in response to a signal from the output terminal OUTP of the operational amplifier 140.

Figure 2:
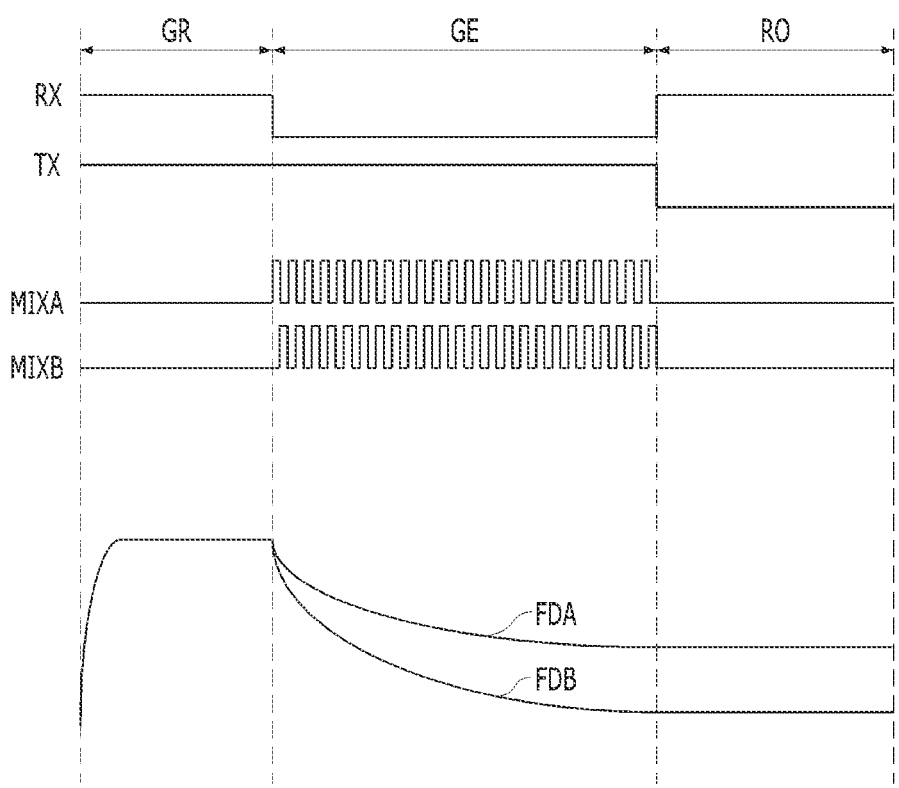
FIG. 2 is a timing diagram illustrating the operation of the image sensor 100 of FIG. 1, according to an embodiment of the present invention.

FIG. 2 is a timing diagram illustrating the operation of the image sensor 100 of FIG. 1, according to an embodiment of the present invention.

Referring to FIG. 2, 'GR' denotes a global reset period. During this period GR, both the reset signal RX and the transfer signal TX may be activated to a high level, and the reset transistors 112 and 122 and the transfer transistors 113 and 123 in the pixel 110 of the first tap and the pixel 120 of the second tap may be turned on, resetting the floating diffusion nodes FDA and FDB.

'GE' denotes a global exposure period. During the period GE, the reset signal RX may be deactivated to a low level, so that the reset transistors 112 and 122 in the pixel 110 of the first tap and the pixel 120 of the second tap may be turned off, and the transfer signal TX may be activated to a high level. Accordingly, the transfer transistors 113 and 123 may be turned on, allowing photocharges sensed by the photodetectors 111 and 121 to be transferred to the floating diffusion nodes FDA and FDB. The first photodetector 111 of the pixel 110 of the first tap may detect light during the period in which the signal MIXA is activated and transfer the photocharge to the first floating diffusion node FDA. The second photodetector 121 of the pixel 120 of the second tap may detect light during the period in which the signal MIXB is activated and transfer the photocharge to the second floating diffusion node FDB. Since the first photodetector 111 detects light during the period in which the signal MIXA is activated, and the second photodetector 121 detects light during the period in which the signal MIXB is activated, the first photodetector 111 and the second photodetector 121 may detect different amounts of light. Accordingly, the voltage level of the first floating diffusion node FDA and the voltage level of the second floating diffusion node FDB may be different from each other due to the operation during the global exposure period GE. In the illustrated example, the voltage level of the first floating diffusion node FDA is higher than the voltage level of the second floating diffusion node FDB.

'RO' denotes a read-out period. During the period RO, an operation for analog-to-digital conversion of the voltage levels of the floating diffusion nodes FDA and FDB generated by the operation in the global exposure period GE may be performed. During the read-out period RO, the reset signal RX may be activated to a high level, so that the reset transistors 112 and 122 may be turned on, and the transfer signal TX may be deactivated to a low level, so that the transfer transistors 113 and 123 may be turned off. In the read-out period RO, the voltage levels of the floating diffusion nodes FDA and FDB generated in the global exposure period GE may remain unchanged.

Figure 3:
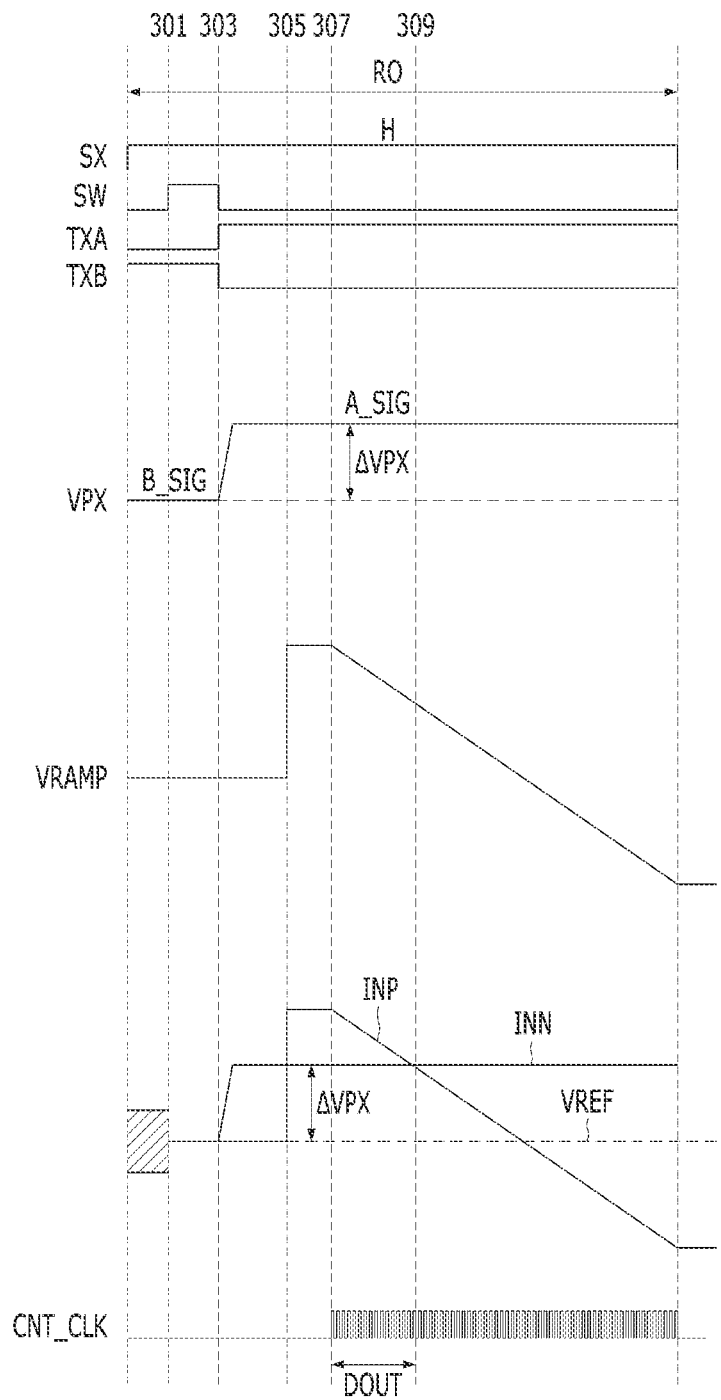
FIG. 3 is a timing diagram illustrating in detail the read-out period RO of FIG. 2.

FIG. 3 is a timing diagram illustrating in detail the read-out period RO of FIG. 2.

Referring to FIG. 3, in the read-out period RO, the selection signal SX may continue to remain at a high level. Until the time point 303, the second tap transfer signal TXB may be activated and the first tap transfer signal TXA may be deactivated. Accordingly, the pixel signal VPX may have a voltage level corresponding to the second floating diffusion node FDB until the time point 303. That is, the pixel signal VPX may be a pixel signal of the pixel 120 of the second tap until the time point 303. In the drawings, the level of the pixel signal VPX of the pixel 120 of the second tap is denoted by 'B_SIG'.

From the time point 301 to the time point 303, the switch signal SW is activated to a high level, so that the first switch 143 and the second switch 144 may be turned on, and the auto zeroing operation of the operational amplifier 140 may be performed. The operational amplifier 140 may perform the auto zeroing operation while receiving the pixel signal (VPX=B_SIG) of the pixel 120 of the second tap via the input terminal INN through the first capacitor 141, and the ramp voltage VRAMP via the input terminal INP through the second capacitor 142. The voltage levels of the two input terminals INN and INP of the operational amplifier 140 may become the same as each other by the auto zeroing operation. In the drawings, the voltage level is denoted by 'VREF'.

From the time point 303, the first tap transfer signal TXA may be activated and the second tap transfer signal TXB may be deactivated. Accordingly, the pixel signal VPX may have a voltage level corresponding to the first floating diffusion node FDA from the time point 303. The pixel signal VPX may be a pixel signal of the pixel 110 of the first tap from the time point 303. In the drawings, the level of the pixel signal VPX of the pixel 110 of the second tap is denoted by 'A_SIG'. In the drawings, 'ΔVPX' may denote the difference between the levels A_SIG and B_SIG of the pixel signal VPX.

Since the level of the pixel signal VPX increases by the difference ΔVPX at the time point 303, the level of the input terminal INN of the operational amplifier 140 may also increase by the difference ΔVPX. From the time point 303, the level of the input terminal INN of the operational amplifier 140 may be 'VREF+ΔVPX'.

From the time point 305, a ramping operation may be performed in which the level of the ramp voltage VRAMP rises and then falls. Accordingly, the voltage level of the input terminal INP may rise and fall in the same form as the ramp voltage VRAMP. From the time point 307 when the voltage of the input terminal INP starts to fall to the time point 309 when the voltage of the input terminal INP becomes equal to the voltage of the input terminal INN, that is, to the time point when the output signal OUTP of the operational amplifier 140 transitions, the counter circuit 150 may generate a digital code DOUT by counting the counting clock CNT_CLK. This digital code DOUT is an analog-to-digital conversion of 'VREF+ΔVPX', and since the voltage level VREF is a known value, an analog-to-digital conversion of the difference ΔVPX may be obtained.

Referring to FIG. 3, a value corresponding to the difference ΔVPX between the pixel signal level A_SIG of the pixel 110 of the first tap and the pixel signal level B_SIG of the pixel 120 of the second tap may be analog-to-digital converted by one analog-to-digital operation, and this value may be used to measure the distance.

Figure 4:
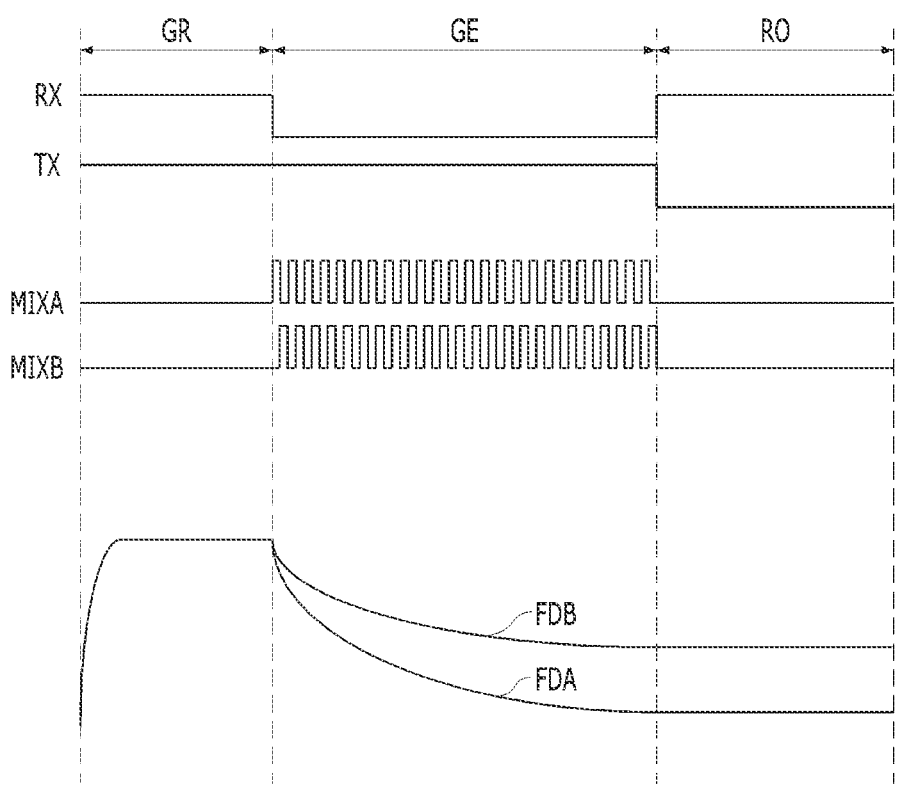
FIG. 4 is a timing diagram illustrating the operation of the image sensor 100 of FIG. 1, according to another embodiment of the present invention.

FIG. 4 is a timing diagram illustrating the operation of the image sensor 100 of FIG. 1, according to another embodiment of the present invention.

Referring to FIG. 4, the signals RX, TX, MIXA, and MIXB may be controlled in the same manner as in FIG. 2, but it may be identified that only the voltage levels of the floating diffusion nodes FDA and FDB, as a result of the operation, are different from those of FIG. 2.

In FIG. 4, it may be identified that the voltage level of the second floating diffusion node FDB is higher than the voltage level of the first floating diffusion node FDA due to the operation during the global exposure period GE.

Figure 5:
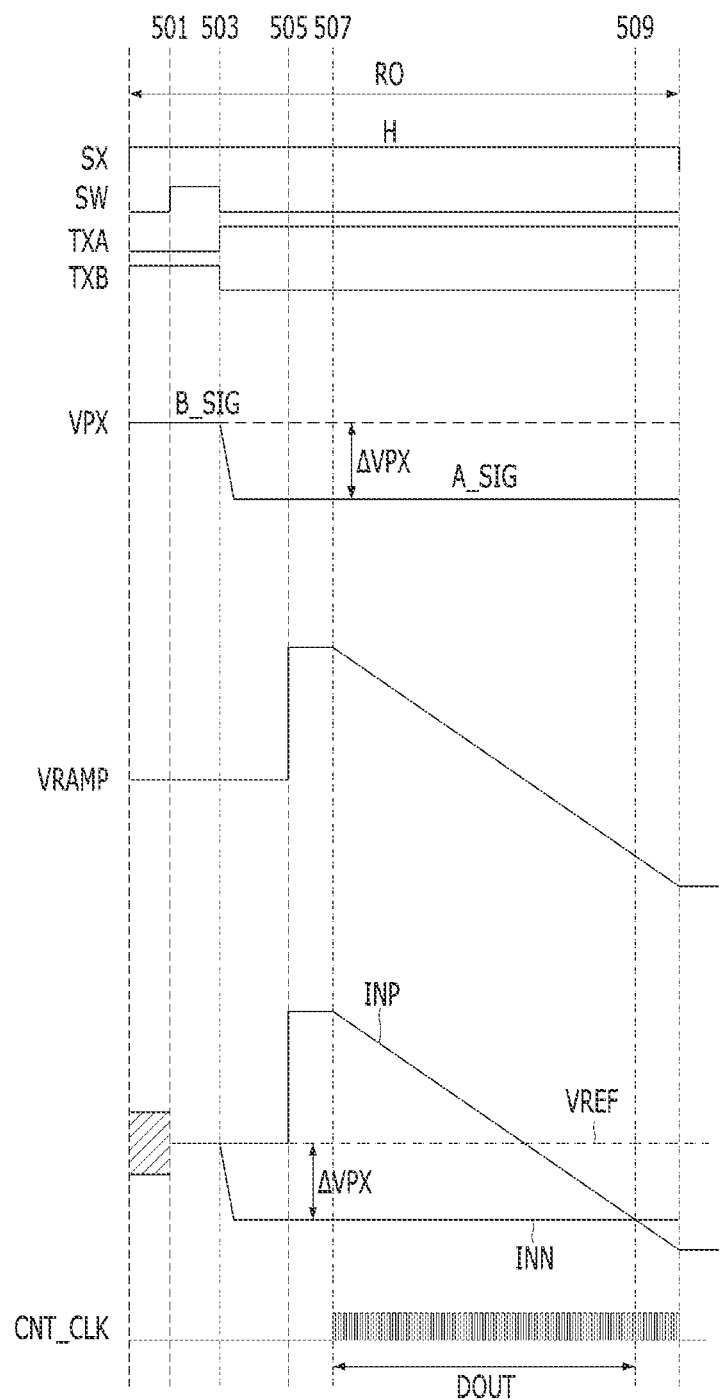
FIG. 5 is a timing diagram illustrating in detail the read-out period RO of FIG. 4.

FIG. 5 is a timing diagram illustrating in detail the read-out period RO of FIG. 4.

Referring to FIG. 5, the signals SX, SW, TXA, and TXB may be controlled in the same manner as in FIG. 3, but it may be identified that the voltage levels of the pixel signal VPX and the input terminal INN, as a result of the operation, are different from those of FIG. 3.

Up to the time point 503, the pixel signal VPX may have a voltage level B_SIG corresponding to the second floating diffusion node FDB and, from the time point 503, the pixel signal VPX may have a voltage level A_SIG corresponding to the first floating diffusion node FDA. Since the voltage level of the first floating diffusion node FDA is lower than the voltage level of the second floating diffusion node FDA, the voltage level of the pixel signal VPX at the time point 503 may be lower than before. In the drawings, ΔVPX may denote the difference between the levels A_SIG and B_SIG of the pixel signal VPX.

Since the level of the pixel signal VPX decreases by the difference ΔVPX at the time point 503, the level of the input terminal INN of the operational amplifier 140 may also decrease by the difference ΔVPX. That is, from the time point 503, the level of the input terminal INN of the operational amplifier 140 may be 'VREF−ΔVPX'.

From the time point 505, a ramping operation may be performed in which the level of the ramp voltage rises and then falls. Accordingly, the voltage level of the input terminal INP may rise and fall in the same form as the ramp voltage VRAMP. From the time point 507 when the voltage of the input terminal INP starts to fall to the time point 509 when the voltage of the input terminal INP becomes equal to the voltage of the input terminal INN, that is, to the time point when the output signal OUTP of the operational amplifier 140 transitions, the counter circuit 150 may generate a digital code DOUT by counting the counting clock CNT_CLK. This digital code DOUT is an analog-to-digital conversion of 'VREF−ΔVPX', and since VREF is a known value, an analog-to-digital conversion of the difference ΔVPX may be obtained.

Referring to FIG. 5, a value corresponding to the difference ΔVPX in voltage between the pixel signal level A_SIG of the pixel 110 of the first tap and the pixel signal level B_SIG of the pixel 120 of the second tap may be analog-to-digital converted by one analog-to-digital operation, and this value may be used to measure the distance.

In the image sensor 100 of FIG. 1, the components other than the components 110, 120 and 130 related to the pixel are for converting the analog voltage output from the pixel 100 into a digital code. Therefore, the present invention may be applied not only to image sensors but also to general analog-to-digital conversion circuits for converting an analog voltage into a digital code. In particular, the present invention may be used to analog-to-digital convert the difference between two voltages.

It should be noted that although the technical spirit of the present invention has been described in connection with preferred embodiments thereof, this is merely for description purposes and should not be interpreted as limiting. It should be appreciated by one of ordinary skill in the art that various changes may be made thereto without departing from the technical spirit of the present invention.

The above described embodiments of the present invention are intended to illustrate and not to limit the present invention. Various alternatives and equivalents are possible. The invention is not limited by the embodiments described herein. Nor is the invention limited to any specific type of semiconductor device. Additions, subtractions, or modifications which are apparent in view of the present disclosure are intended to fall within the scope of the appended claims.

What is claimed is:

1. An image sensor, comprising:
   a pixel of a first tap;
   a pixel of a second tap;
   an operational amplifier configured to perform an auto zeroing operation with a pixel signal of the pixel of the second tap applied, and to perform an operation for comparison between a ramp voltage and a pixel signal output from the pixel of the first tap with the pixel signal of the pixel of the first tap applied; and
   a counter circuit configured to generate a digital code in response to an output of the operational amplifier.

2. The image sensor of claim 1, wherein the pixel of the first tap and the pixel of the second tap are exposed in different periods.

3. The image sensor of claim 1, wherein the operational amplifier is further configured to receive the pixel signal of the pixel of the second tap via a first input terminal through a first capacitor during the auto zeroing operation and the pixel signal of the pixel of the first tap via the first input terminal through the first capacitor during the comparison operation, and
   receive the ramp voltage via a second input terminal through a second capacitor.

4. The image sensor of claim 1, wherein the pixel of the first tap includes:
   a first photodetector connected to a first node;
   a first reset transistor configured to reset the first node in response to a reset signal;
   a first transfer transistor configured to electrically connect the first node with a first floating diffusion node in response to a transfer signal;
   a first capacitor connected to the first floating diffusion node; and
   a first tap transfer transistor configured to electrically connect the first floating diffusion node with an output node in response to a first tap transfer signal.

5. The image sensor of claim 4, wherein the pixel of the second tap includes:
   a second photodetector connected to a second node;
   a second reset transistor configured to reset the second node in response to the reset signal;
   a second transfer transistor configured to electrically connect the second node with a second floating diffusion node in response to the transfer signal;
   a second capacitor connected to the second floating diffusion node; and
   a second tap transfer transistor configured to electrically connect the second floating diffusion node with the output node in response to the second tap transfer signal.

6. The image sensor of claim 5, further comprising a pixel signal generator configured to generate the pixel signals to be applied to the operational amplifier using a voltage level of the output node.

7. The image sensor of claim 6, wherein the pixel signal generator includes:
   a driving transistor configured to supply a current to a third node in response to the voltage level of the output node;
   a selection transistor configured to electrically connect the third node with a pixel node where the pixel signals are output in response to a selection signal; and
   a current source configured to sink a current from the pixel node.

8. The image sensor of claim 7,
   wherein the reset signal is activated and the transfer signal is deactivated, during a global reset operation period,
   wherein the reset signal is deactivated and the transfer signal is deactivated, during a global exposure period,
   wherein the second tap transfer signal is activated and the first tap transfer signal is deactivated and the selection signal is activated, during the auto zeroing operation period, and
   wherein the first tap transfer signal is activated and the second tap transfer signal is deactivated and the selection signal is activated, during the comparison operation period.

9. The image sensor of claim 8, wherein, during the auto zeroing operation period, a positive input terminal and a negative output terminal of the operational amplifier are shorted and a negative input terminal and a positive output terminal of the operational amplifier are shorted.

10. The image sensor of claim 8, wherein a period in which the first photodetector is activated and a period in which the second photodetector is activated in the global exposure period are different from each other.

11. An analog-to-digital converter, comprising:
    an operational amplifier configured to perform an auto zeroing operation with a first voltage applied, and an operation of comparison between a second voltage and a ramp voltage with the second voltage applied; and
    a counter circuit configured to generate a digital code in response to an output of the operational amplifier,
    wherein the digital code corresponds to a difference in voltage level between the first voltage and the second voltage.

12. The analog-to-digital converter of claim 11, wherein the operational amplifier:
    receives the first voltage via a first input terminal through a first capacitor during the auto zeroing operation and the second voltage via the first input terminal through the first capacitor during the comparison operation, and
    receives the ramp voltage via a second input terminal through a second capacitor.

13. The analog-to-digital converter of claim 11, wherein, in the auto zeroing operation period, the first input terminal is coupled to a first output terminal of the operational amplifier and the second input terminal is coupled to a second output terminal of the operational amplifier.

14. An operating method of an image sensor, the operating method comprising:
- receiving, by an operational amplifier, a first voltage from a pixel of a first tap;
- performing, by the operational amplifier, an auto zeroing operation thereon;
- comparing, by the operational amplifier, a ramp voltage with a second voltage from a pixel of a second tap; and
- generating, by a counter, a digital code representing difference between the first and second voltages based on a result of the comparing.

* * * * *